United States Patent [19]
Peek

[11] Patent Number: 5,396,092
[45] Date of Patent: Mar. 7, 1995

[54] WIRING ARRANGEMENT FOR A SEMICONDUCTOR DEVICE USING INSULATING AND ETCH STOP LAYERS

[75] Inventor: Hermanus L. Peek, Eindhoven, Netherlands

[73] Assignee: U.S. Philips Corporation, New York, N.Y.

[21] Appl. No.: 225,403

[22] Filed: Apr. 8, 1994

Related U.S. Application Data

[63] Continuation of Ser. No. 83,867, Jun. 28, 1993, abandoned, which is a continuation of Ser. No. 821,212, Jan. 16, 1992, abandoned.

[30] Foreign Application Priority Data

Jan. 21, 1991 [NL] Netherlands ............... 9100094

[51] Int. Cl.⁶ .............. H01L 23/485; H01L 29/62
[52] U.S. Cl. .............................. 257/249; 257/754; 257/758
[58] Field of Search ............ 257/752, 758–760, 257/754–756, 249, 250, 208, 211, 750, 751, 767

[56] References Cited

U.S. PATENT DOCUMENTS

| | | | |
|---|---|---|---|
| 4,163,239 | 7/1979 | Carter | 257/249 |
| 4,291,328 | 9/1981 | Lien et al. | 257/760 |
| 4,488,166 | 12/1984 | Lehrer | 257/756 |
| 4,618,878 | 10/1986 | Aoyama et al. | 257/760 |
| 4,728,627 | 3/1988 | Mase et al. | 257/758 |
| 4,754,311 | 6/1988 | Davids et al. | 257/249 |
| 4,808,552 | 2/1989 | Anderson | 257/758 |

FOREIGN PATENT DOCUMENTS

| | | | |
|---|---|---|---|
| 0108251 | 5/1984 | European Pat. Off. | 257/249 |
| 0224013 | 4/1987 | European Pat. Off. | 257/752 |
| 0272051 | 6/1988 | European Pat. Off. | 257/754 |

OTHER PUBLICATIONS

IBMTDB, Low Sheet Resistance Gate Electrode with Conventional Borderless Contacts, vol. 32, No. 6B, Nov. 1989, pp. 122–123.

J. L. Yeh et al, IEEE Proc. VLSI MIC, pp. 95–100, 1988.

*Primary Examiner*—Robert P. Limanek
*Assistant Examiner*—Peter Toby Brown
*Attorney, Agent, or Firm*—Steven R. Biren

[57] ABSTRACT

An integrated circuit has an interconnection pattern which is recessed in the insulating layer, for example, an oxide layer. A groove is etched in the insulating layer corresponding to the metal pattern by means of a mask which is the inverted image of the interconnection pattern during manufacture. Etching is continued until contact windows are fully opened. To prevent the oxide between the contact windows also being removed, an etching stopper layer is provided in the oxide layer. A layer already present in the process may be used for this etching stopper layer, for example, a polycrystalline silicon layer, so that extra process steps are made redundant.

2 Claims, 2 Drawing Sheets

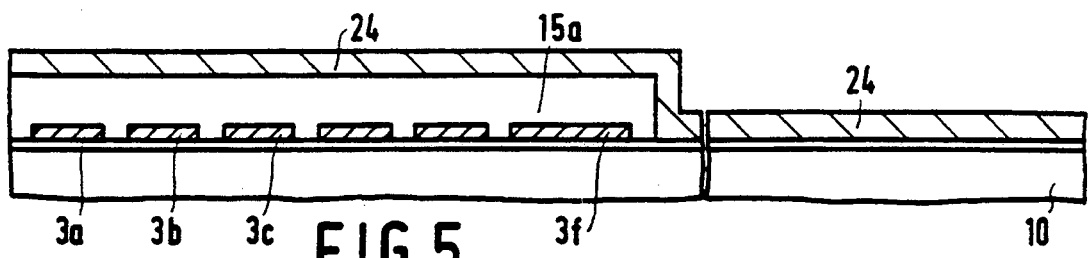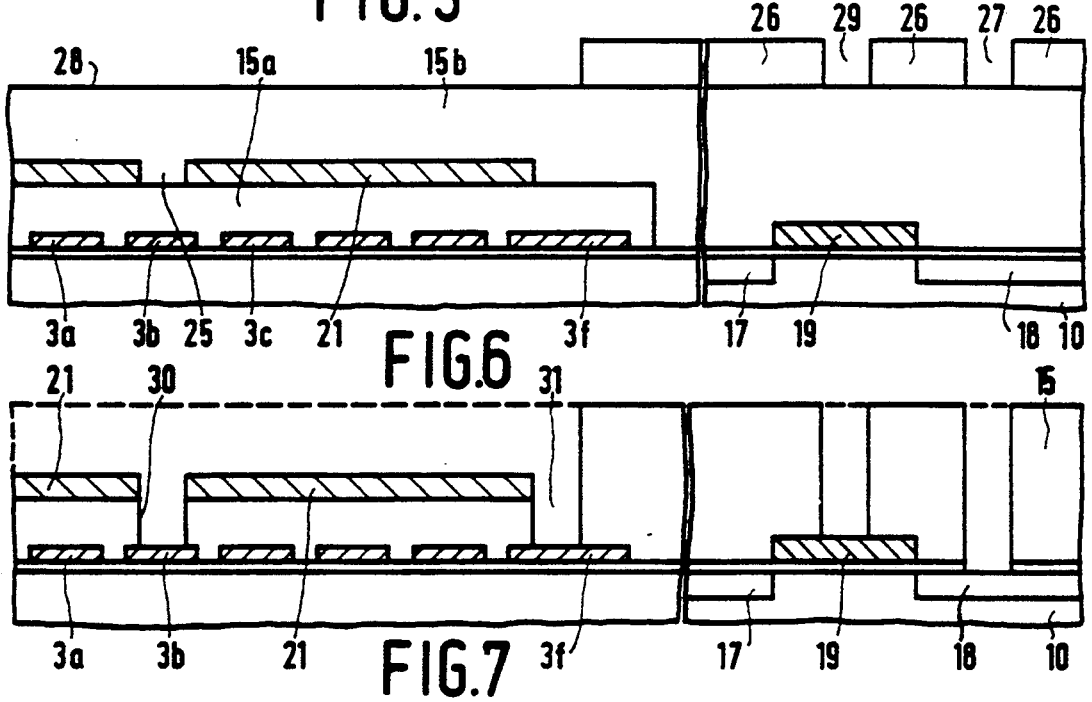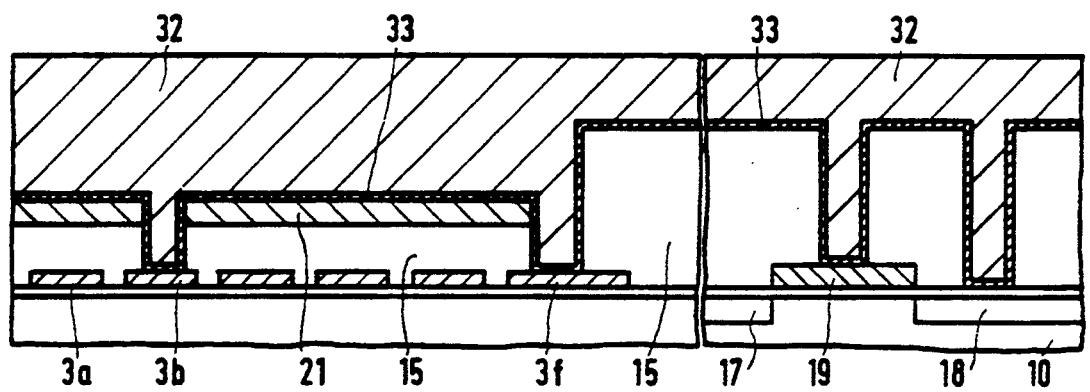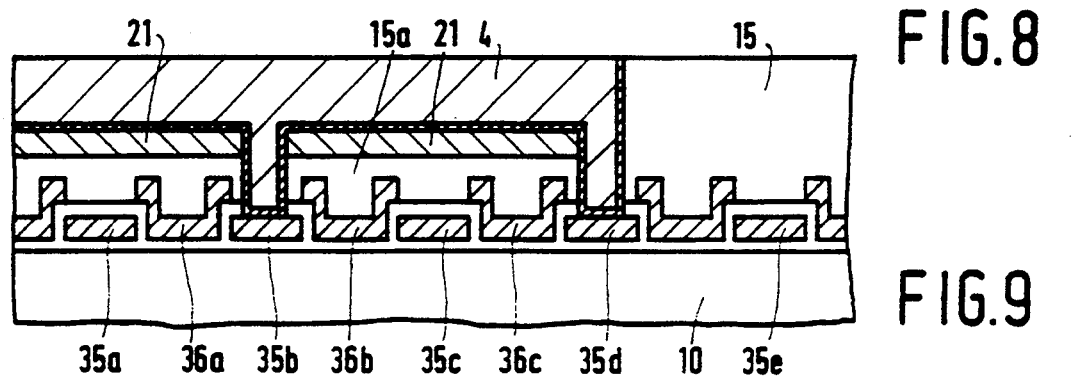

WIRING ARRANGEMENT FOR A SEMICONDUCTOR DEVICE USING INSULATING AND ETCH STOP LAYERS

This is a continuation of application Ser. No. 08/083,867, filed Jun. 28, 1993, and now abandoned which is a continuation of Ser. No. 07/821,212, filed Jan. 16, 1992, and also abandoned.

BACKGROUND OF THE INVENTION

The invention relates to a semiconductor device comprising a semiconductor body having at a surface one or several circuit elements with at least two conductive regions, the surface being coated with an insulating layer on which a conductor track is provided which interconnects the conductive regions through contact windows in the insulating layer and which is recessed into the insulating layer over at least substantially its entire thickness.

The invention also relates to a method of manufacturing a semiconductor device comprising a semiconductor body having at a surface one or several circuit elements with at least two conductive regions, the surface being coated with an insulating layer on which a conductor track is formed which interconnects the conductive regions through contact windows in the insulating layer and which is recessed into the insulating layer over at least substantially its entire thickness. The term "conductive regions" is to be widely interpreted here so as to include: doped semiconductor zones in the semiconductor body, gate electrodes of field effect devices, portions of subjacent wirings, contact surfaces, etc.

It is usual in complicated integrated circuits to use multilayer interconnections with one or several of the lower interconnection layers made of polycrystalline silicon (poly) and/or silicide, and the upper layer or layers made of metal, such as Al. It is usual thereby to connect poly tracks (or silicide tracks) and monocrystalline zones in the body to the first metal layer by means of metal plugs. These mostly contain W, or TiW and W. The first metal layer is also connected to the second metal layer by means of plug connections.

A semiconductor device and a method of the kind described in the opening paragraph are described in the publication "Reverse Pillar and Maskless Contact - Two novel recessed metal schemes and their comparisons to conventional VLSI metallization schemes" by J. L. Yeh et al. in IEEE Proc. VLSI MIC, pp. 95-100, Santa Clara 1988. In this known method, a mask which is the inverted image of the interconnection pattern in the insulating layer is used for etching a pattern corresponding to the interconnection pattern over part of the thickness of the insulating layer. The contact windows are then formed by means of an additional photoresist mask which covers the insulating layer with the exception of the contact windows to be formed. Then a metal layer is provided, from which the interconnection pattern is formed by etching back. The interconnection pattern lies recessed in the insulating layer, so that the structure remains planar. In addition, no plugs are required for the connections between the interconnection pattern and semiconductor zones or poly tracks.

SUMMARY OF THE INVENTION

In this known process, a separate photoresist mask is required for the definition of the contact windows. It is an object of the invention to render this photoresist mask redundant and thus to simplify the manufacture of the device considerably.

A semiconductor device of the kind described in the opening paragraph according to the invention is characterized in that an etching stopper layer is present in an interposed region between the conductive regions, which layer separates the conductor track from a subjacent portion of the insulating layer and which comprises a material which is selectively etchable relative to the insulating layer, while the etching stopper layer forms part of a layer pattern manufactured from a common layer, which pattern comprises besides the etching stopper layer further portions elsewhere in the device.

A polycrystalline silicon layer, for example, or a dielectric layer of a material different from the insulating layer may be used for the etching stopper layer. Since such a layer is usually present in the process anyway, it is not necessary to use a separate photomask for the contact windows.

According to the invention, a method of the kind described in the opening paragraph is characterized in that, after the conductive regions have been provided, the insulating layer is formed over a first part of its thickness, in that an etching stopper layer of a conductive material which is selectively etchable relative to the insulating layer is formed on this part in an intermediate region situated between the conductive regions, and in that subsequently the insulating layer is provided over a second part of its thickness, upon which the insulating layer is subjected to an etching treatment at the area of the conductor track to be formed, during which it is removed in the said intermediate region down to the etching stopper layer and at the area of the contact windows down to the conductive regions, after which the configuration thus obtained is covered with a conductive layer, from which the recessed conductor track is formed by etching back.

BRIEF DESCRIPTION OF THE DRAWING

In the drawing:

FIGS. 5-8 show the device in a number of stages of manufacture thereof;

FIG. 9 is a cross-section of a second embodiment of the device.

DETAILED DESCRIPTION OF THE INVENTION

Figures 1, 2:
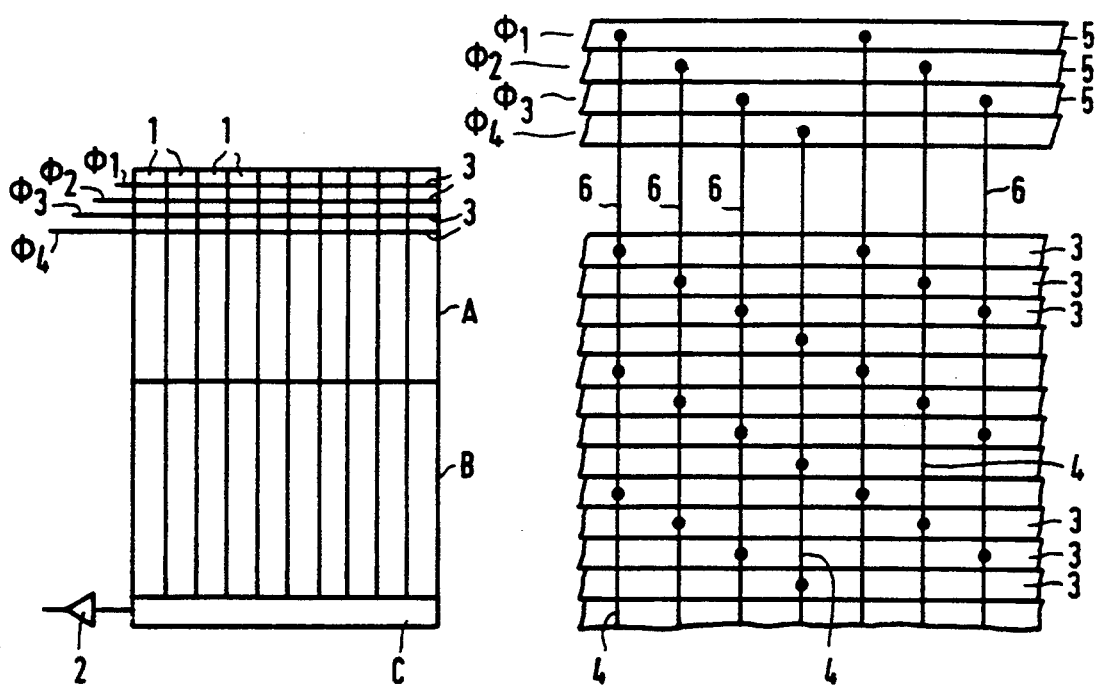
FIG. 1 shows the diagram of a charge-coupled image sensor of the raster transfer type.
FIG. 2 shows a portion of the device depicted in FIG. 1 with the diagrammatically indicated connections between the clock lines and the clock electrodes according to the invention.

The invention will now be described in more detail with reference to the drawing and to an embodiment.

More particularly, the invention will be explained in more detail with reference to a charge-coupled device, more particularly an imaging device for which the invention is especially important. It will be quite clear from the description, however, that the invention may also be advantageously used in other types of integrated circuits.

FIG. 1 shows a diagrammatic plan view of a raster transfer imaging device comprising a system of vertical CCD lines 1 situated next to one another divided into an imaging section A and a memory section B. The imaging section A serves, as is known, for converting a projected image into charge packages. At the end of the imaging period, these charge packages are quickly transported to the memory section B which is screened from incident radiation. At the lower side of the memory section there is provided the horizontal readout register C which is provided with an output amplifier 2. The charge packages stored in the B section are transported to the readout register C row by row and read sequentially at the output amplifier 2. The charge transport and charge storage are controlled by clock voltages which are applied to clock electrodes 3, four of which are diagrammatically depicted in FIG. 1, $\phi 1$, $\phi 2$, $\phi 3$ and $\phi 4$.

It is usual for the clock electrodes to be made by the double- or triple-layer poly-Si technology, by means of which an overlapping gate structure is made in two or three layers. A drawback of this technology is that the structure onto which the image is projected is of very imperfect flatness, so that light can be deflected towards insensitive regions. In addition, it is difficult in the case of a colour sensor to provide a color filter in an accurate manner. The poly layers used are usually 0.3–0.5 $\mu$m thick, which is too thick for transmitting sufficient blue light. Therefore, a photosensitive surface free from poly-Si is often formed through adaptation of the gate configuration. The thickness of the poly-Si is so great because otherwise, i.e. in the case of a smaller thickness, the resistance becomes too great, and thus the RC time per clock phase. In the embodiment to be described here, a single-layer poly technology will be used for the clock electrodes of at least the A section with a very thin poly layer, approximately 50 nm thick, so that the sensor has a good sensitivity to the entire visible spectrum, there is no overlap between the gates of the various phases, and the structure is topographically very planar.

FIG. 2 is a diagrammatic plan view of part of the electrode configuration in the imaging section A. The clock electrodes 3 are formed by non-overlapping comparatively high ohmic polystrips with a thickness of 50 nm situated next to one another. The clock electrodes 3 are connected to low-ohmic metal tracks 4 which are connected to the clock electrodes 3 at the areas of the dots. In the embodiment shown of a 4-phase CCD, each metal track 4 is connected to each fourth clock electrode 3. The metal tracks 4 may be made very narrow, so that comparatively wide spaces remain open between the metal tracks, through which spaces the light may penetrate into the semiconductor body. As is shown in FIG. 2, the clock electrodes 3 may each be connected to the clock lines by a number of interspaced tracks 4 in order to obtain the desired low RC time value. At the upper side of the CCD matrix, the metal tracks 4 may be connected to four clock lines 5, by means of which the clocks $\phi 1$, $\phi 2$, $\phi 3$ and $\phi 4$ are provided, via connections 6.

Figure 3:
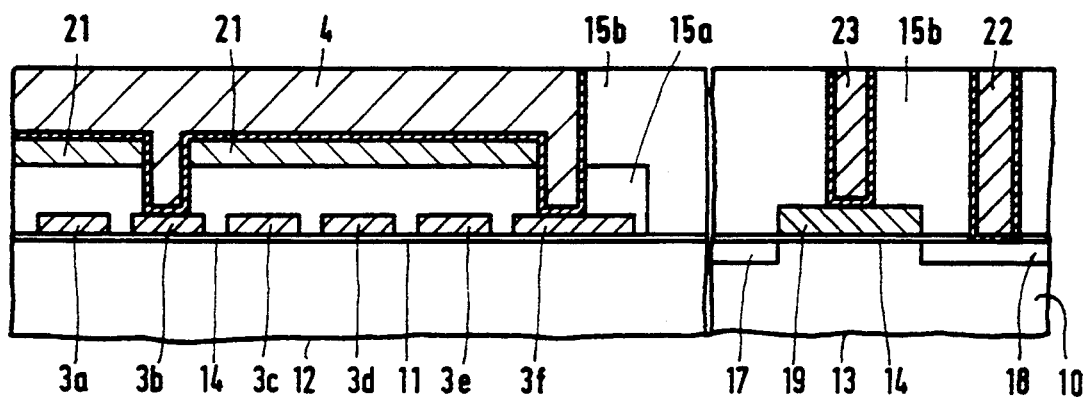
FIG. 3 is a cross-section of a portion of the device according to FIG. 2.
Figure 4:
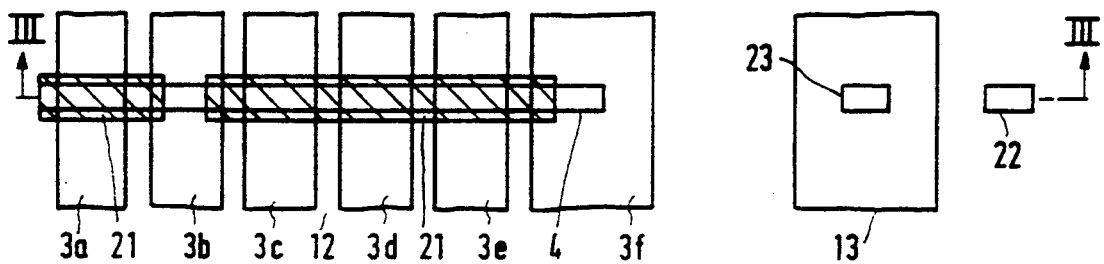
FIG. 4 is a plan view of the portion shown in FIG. 3.

FIG. 3 shows in cross-section a portion of a semiconductor device in which the invention is incorporated, with a portion of a charge-coupled device to be used in the imaging section A of the imaging device according to FIG. 2, and an MOS transistor which is integrated with the charge-coupled device. FIG. 4 gives a diagrammatic plan view of the portion shown in FIG. 3.

The device comprises a semiconductor body 10 of silicon with a surface 11 at which or near which the charge-coupled device 12 and the MOS transistor 13 are situated. The charge-coupled device comprises a range of clock electrodes 3a, 3b, 3c, etc. formed by thin, approximately 50 nm thick polycrystalline silicon tracks. These clock electrodes 3 constitute the conductive regions referred to above and are separated from the surface 11 by the thin dielectric layer 14. In the present embodiment, the gate dielectric only comprises a silicon oxide layer, but it may obviously also consist of a different insulating material or of double layers of, for example, silicon oxide and silicon nitride. The clock electrodes 3 are embedded in a dielectric layer 15 which may be entirely of silicon oxide, but which may obviously also be composed entirely or partly of other materials. The layer 15 is composed of two portions 15a and 15b, which will be discussed below.

The MOS transistor 13 comprises a source and a drain zone 17, 18 and a gate electrode 19 which is insulated from the subjacent channel region by the gate oxide 14.

In the insulating layer 15, or at least in the portion 15a of the insulating layer, a conductor track 4 is formed which interconnects the conductive regions 3b and 3f (clock electrodes) via contact windows in the insulating layer 15. The conductor tracks 4 is embedded in the layer 15 over at least substantially its entire thickness, so that a practically planar upper surface is obtained. According to the invention, an etching stopper layer 21 separating the conductor track 4 from the subjacent portion 15a of the insulating layer 15 is present in the intermediate region between the conductive regions 3b and 3f. The layer 21 comprises a material which is different from that of the insulating layer 15 and relative to which the layer 15 can be selectively etched.

The provision of the etching stopper layer requires no extra process steps since the layer 21 forms part of a layer pattern manufactured from a common layer, which pattern comprises besides the etching stopper layer 21 further portions in the device and which can accordingly be formed simultaneously with these further portions. In the present embodiment, the etching stopper layer 21 is made of polycrystalline silicon which together with the gate 19 of the transistor 13 belongs to the second polycrystalline wiring layer. The thickness of this second layer is approximately 0.4 $\mu$m and is chosen to be much greater, for reasons of resistance, than the thickness of the gates 3a, 3b, etc. which is only approximately 50 nm for reasons of photosensitivity. The transistor 13 is further provided with a contact 22 which is connected to the drain zone 18, and with a contact 23 which is connected to the gate 19, the contacts 22, 23 being formed by plugs. The contact 23 is drawn above the channel region in the drawing. In actual fact, however, it will preferably be provided above the field oxide not shown in the drawing.

A few steps in the manufacture of the device according to FIGS. 3 and 4 will be described with reference to FIGS. 5–7. The device is shown in these FIGS. in the same cross-section as in FIG. 3.

FIG. 5 shows the stage in which the clock electrodes 3 are formed from an approximately 50 nm thick polycrystalline silicon layer.

The clock electrodes are then coated with an oxide layer 15a. This layer, which may be provided by, for example, CVD techniques known per se and local removal through etching, has a thickness of approximately 0.3 $\mu$m. Then an approximately 0.4 $\mu$m thick second polycrystalline silicon layer 24 is provided by deposition. By means of photolithographic steps known per se, the gate 19 of the MOS transistor 13 is formed from this layer, and as well as the etching stopper layer 21. The width of the etching stopper layer is 1.7–2 μm and is chosen to be somewhat greater than the width of the conductor track 4 to be provided in a later stage. The layer 21 has an interruption with a width of approximately 1.1 μm at the area of the connection to be provided between the conductor track 4 and the clock electrode 3b, at a width of approximately 2 μm of the clock electrode 3b. The entire assembly is then covered with a thick oxide layer 15b, having a thickness of approximately 1 μm. A mask 26 in the form of a photoresist layer is formed on the surface of this oxide layer, which mask is complementary to, or the inverted image of, the metal pattern to be obtained at a later stage. The mask 26 has openings 27, 29 at the areas of the contacts 22, 23 and an opening 28 at the area of the conductor tracks 4 to be formed. The width of the opening 28, which is situated as symmetrically as possible above the etching stopper layer 21, is approximately 1.1 so that the etching stopper layer projects by approximately 0.3–0.5 μm on either side of the opening 28. In this stage of the process, the source and drain zones 17, 18 of MOS transistors and other zones may also be provided. The device is then in the stage as shown in FIG. 6. Then the device is subjected to an etching treatment during which the oxide layer 15a, 15b is removed at the areas of the openings 27, 28, 29. The etching treatment is carried out selectively in that the polycrystalline silicon of the clock electrode 3, or the gates 19 and the etching stopper layer 21 are not attacked or at least attacked to a much lesser degree during etching of the oxide. Etching is preferably carried out in an anisotropic plasma etching stage to prevent underetching. Etching of the oxide is continued down to a depth where a different material is present, i.e. for example up to the monocrystalline Si material at the area of the source or drain zone 18, down to the polycrystalline Si material at the area of the gate 19 of the MOS transistor and the etching stopper layer 21. Contact window 30 is formed at the area of the clock electrode 3b, where the etching stopper layer 21 has an interruption 25. Etching of the oxide layer 15 continues down to the polycrystalline Si material of the first poly layer. The width of the window 30 in the direction of the cross-section of FIG. 7 is determined by the width of the interruption 25 in the etching stopper layer 21. The width in the direction transverse to the plane of the drawing is determined by the mask 26. The width of the contact window 31 at the area of the poly track 3f is determined, in the cross-section of FIG. 7, by the spacing between the etching stopper layer 21 to the left of the window 31 and the edge of the mask 26 to the right of the window 31 to be formed. The width of the window 31 in the direction transverse to the plane of the drawing is again determined by the mask 26.

After etching, the remainder of the mask 26 is removed after, upon which a thick metal layer 32 (FIG. 8) is provided, which layer 32 covers the entire surface. Tungsten is chosen for the layer 32 in the present embodiment. Obviously, other suitable materials may also be chosen. Before the layer 32 is provided, a thin layer of TiW 33 may be provided, for example, by sputtering. The layer 33 ensures a good adhesion of the metal layer 32 and also forms a good barrier against diffusion.

After the metal deposition, the metal layers 32/33 are subjected to an etching treatment and etched back to the upper surface of the thick oxide layer 15. The configuration of FIG. 3 is then obtained.

The use of the second polycrystalline silicon layer for the etching stopper layer 21 renders the use of an extra mask for masking the oxide layer 15 in the intermediate region between the contact windows 30, 31 to be formed redundant. Only two polycrystalline silicon layers are used in the embodiment described here.

FIG. 9 gives in cross-section an embodiment comprising three polycrystalline layers. Only part of a CCD channel is shown in the drawing. The charge-coupled device comprises clock electrodes in two poly layers, i.e. the clock electrodes 35a, b, c in poly 1, and the clock electrodes 36a, b, c in poly 2. The thickness of the two poly layers is between, for example, 0.3 and 0.5 μm. This thickness is much greater than the thickness of the CCD electrodes 3 in the preceding embodiment, so that the resistance will be much lower. Nevertheless, it may yet be advantageous also in this case to connect the electrodes to low-ohmic bridge connections 4, for example, when the dimensions of the image sensor are very great.

In the manufacture of the device shown in FIG. 9, first the electrodes 35a, 35b, 35c are formed from a first polycrystalline silicon layer, with openings between the electrodes. After coating of the electrodes 35 with an oxide layer, a second polycrystalline silicon layer is deposited, from which the clock electrodes 36a, 36b, 36c are formed, fills up the openings between the electrodes 35. The electrodes 36 may overlap the electrodes 35, as is shown in FIG. 9. In a next stage, the electrodes 35, 36 are covered with the oxide layer 15a, after which a third polycrystalline silicon layer is deposited, from which the etching stopper layer 21 is formed. Since this third poly layer is necessary elsewhere in any case, inter alia for the parallel-serial interface (not shown in FIG. 9) between the memory section B and the horizontal readout register C (see FIG. 1 ), the provision of the etching stopper layer 21 does not require an extra deposition step and mask. The gate 19 of an MOS transistors (not shown in FIG. 9) may be formed in poly 2 before doping stages for source and drain zones are implemented. When the etching stopper layer 21 has been formed, the manufacture of the device can be continued in a manner analogous to that for the preceding embodiment. A thick oxide layer 15 is then deposited first, in which the pattern of the wiring to be shaped is provided by means of an inverted metal mask. Etching continues at the areas of the gates 35b and 35d down to the poly material of these gates. In the area situated between these gates, etching is stopped by the etching stopper layer 21. After the etching treatment, the recessed metal pattern with the bridge connection 4 is formed in the manner described above by means of deposition and etching back.

It will be obvious that the invention is not limited to the embodiments given here, but that many variations are possible to those skilled in the art within the scope of the invention. Thus the invention may also be applied in different types of charge-coupled devices as well as in integrated circuits without charge-coupled devices. Besides bridge connections between gate electrodes, connections between surface zones in the semiconductor body or between zones and gates of conductor tracks may also be formed in the manner described here. The etching stopper layer 21 need not necessarily consist of polysilicon, it may alternatively consist of a different material, for example, silicide. Instead of W or TiW, other metals or conductive materials, such as doped semiconductor material, may be used for the connections 4.

I claim:

1. A semiconductor device comprising a semiconductor body having an insulating layer portion upon a surface thereof and at least two spaced conductor regions on said insulating layer portion, said conductor regions being covered by and completely recessed in a further insulating layer portion, and said conductor regions being separated one from another by said further insulating layer portion, a conductive track above said further insulating layer portion and having parts recessed into said further insulating layer portion and interconnecting said at least two spaced conductor regions through windows provided in said further insulating layer portion, characterized that an etching stopper layer of a material different from that of said further insulating layer portion separates said conductive track from said further insulating layer portion at regions of said further insulating layer portion spacing said conductor regions one from another and at regions covering said conductor regions, said etching stopper layer being selectively etchable relative to said further insulating layer portion, apertures in said etching stopper layer defining the locations of said windows, said etching stopper layer comprising polycrystalline silicon and portions of said etching stopper layer forming further parts of said semiconductor device other than etching stoppers.

2. A semiconductor device as in claim 10, wherein said at least two conductor regions form clock electrodes of an array of clock electrodes of a charge-coupled device, which array forms part of a common wiring layer, said clock electrodes being formed from a first polycrystalline silicon layer and said etching stopper layer being formed from a second polycrystalline silicon layer which is electrically separated from the first polycrystalline silicon layer by an interposed portion of the further insulating layer portion, the thickness of the second polycrystalline silicon layer being greater than that of the first polycrystalline silicon layer.

* * * * *